United States Patent [19]

Hayakawa

[11] Patent Number: 5,773,847
[45] Date of Patent: Jun. 30, 1998

[54] SEMICONDUCTOR DEVICE HAVING AN ACTIVE LAYER WITH SEPARATE LAYERS WHERE ONE OF THE LAYERS ACTS AS CRYSTAL NUCLEI FOR THE OTHER

[75] Inventor: Masahiko Hayakawa, Kanagawa, Japan

[73] Assignee: Semiconductor Energy Laboratory Co., Ltd., Kanagawa, Japan

[21] Appl. No.: 922,381

[22] Filed: Sep. 3, 1997

Related U.S. Application Data

[63] Continuation of Ser. No. 452,705, May 30, 1995, abandoned.

[30] Foreign Application Priority Data

Jun. 7, 1994 [JP] Japan .................................... 6-148560

[51] Int. Cl.⁶ ...................... H01L 29/76; H01L 31/036; H01L 31/112
[52] U.S. Cl. .......................... 257/66; 257/347; 257/607
[58] Field of Search ............................. 257/66, 57, 347, 257/607

[56] References Cited

U.S. PATENT DOCUMENTS

| | | | |
|---|---|---|---|
| 4,719,501 | 1/1988 | Nakagawa et al. | 257/66 |
| 4,871,920 | 10/1989 | Stabile et al. | 250/551 |
| 5,087,954 | 2/1992 | Shirai | 257/544 |
| 5,147,826 | 9/1992 | Liu et al. . | |
| 5,275,851 | 1/1994 | Fonash et al. . | |
| 5,401,982 | 3/1995 | King et al. | 257/66 |
| 5,403,772 | 4/1995 | Zhang et al. | 257/66 |
| 5,508,533 | 4/1996 | Takemura | 257/66 |
| 5,563,426 | 10/1996 | Zhang et al. | 257/66 |
| 5,569,936 | 10/1996 | Zhang et al. | 257/66 |

OTHER PUBLICATIONS

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

"Crystallized Si Films By Low–Temperature Rapid Thermal Annealing Of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S. J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

*Primary Examiner*—Ngân V. Ngô
*Attorney, Agent, or Firm*—Sixbey Friedman Leedom & Ferguson, P.C.; Gerald J. Ferguson, Jr.

[57] ABSTRACT

A semiconductor device having a active layer comprising crystalline silicon, said active layer comprising a first layer comprising crystalline silicon formed on an insulating surface and a second layer comprising crystalline silicon formed on said first layer, wherein said first layer contains a metal element at a first concentration while said second layer is free from said metal element or contains said metal element at a second concentration which is lower than said first concentration.

12 Claims, 4 Drawing Sheets

SEMICONDUCTOR DEVICE HAVING AN ACTIVE LAYER WITH SEPARATE LAYERS WHERE ONE OF THE LAYERS ACTS AS CRYSTAL NUCLEI FOR THE OTHER

This application is a Continuation of Ser. No. 08/452,705, filed May 30, 1995 now abandoned.

FIELD OF THE INVENTION

The present invention relates to a semiconductor device in which a semiconductor having crystallinity is used, and to a manufacturing method for the same.

BACKGROUND OF THE INVENTION

A thin film transistor (TFT) is a known device in which a thin film semiconductor is used. A TFT is composed by forming a thin film semiconductor on a substrate and using this thin film semiconductor for the semiconductor regions of a transistor. TFTs are used for various integrated circuits, and particularly for active matrix type liquid crystal display units and the like.

As the thin film semiconductor in a TFT, it is convenient to use an amorphous silicon film but there is the problem that they have poor electrical characteristics. Accordingly, a crystalline silicon film is utilized in order to improve the characteristics of a TFT. To obtain this crystalline silicon film, an amorphous silicon film is formed and then crystallized by a heat treatment.

However, the crystallization by heating has required a high temperature process at 600° C. or higher, and in addition, it has been necessary to take 10 hours or longer. This has caused the problem that it is difficult to use an inexpensive glass substrate having a low distortion point.

Research carried out by the present inventors has shown that the addition of trace amounts of elements such as nickel, palladium and lead to an amorphous silicon film makes it possible to carry out crystallization by heat treatment of about 4 hours in a low temperature process of 550° C. or lower. Further, it has become clear that also when the crystallization is carried out by laser, the same effect can be obtained.

However, the presence large quantities of impurities such as nickel in a semiconductor damage the device characteristics and reliability of a device using the semiconductor, and is undesirable. That is, elements such as nickel needed in crystallizing an amorphous silicon, are required not to be contained as far as possible in the crystalline silicon obtained.

Further, when the crystallization is carried out by laser, ridges of the crystal growth on a crystal surface in the form of projections are formed. Since the ridges have an influence on the flatness of a film surface, it is desirable that as far as possible they do not exist.

SUMMARY OF THE INVENTION

An object of the present invention is to form a thin film semiconductor layer having a very low content of elements such as nickel by employing heat crystallization in a low temperature process.

The present invention is characterized in that an amorphous silicon film is divided into two layers and a heat crystallization process is carried out twice to thereby easily obtain a crystalline silicon film having a very low content of elements such as nickel by a low temperature process.

In the present invention, since the most remarkable effect can be obtained when nickel is used, nickel will be used in the following description. However, other usable elements include Pt, Cu, Ag, Au, In, Sn, Pd, P, As, and Sb. Further, there can be used as well one or more elements selected from the VIII group elements and the IIIb, IVb and Vb group elements.

First, nickel which promotes the crystallization of an amorphous silicon film, is introduced into the amorphous silicon film constituting the first layer, and a heat treatment is carried out to crystallize the amorphous silicon film. Then, an amorphous silicon film constituting the second layer is formed, and heat treatment is carried out to crystallize this amorphous silicon film. In this way, a crystalline silicon film suitable for a thin film semiconductor layer is obtained.

For the introducing method for the nickel element promoting the crystallization, a layer containing nickel or a nickel compound can be formed in contact with the amorphous silicon film. For forming the nickel-containing layer, a method in which a solution containing nickel is coated and then dried (for example, spin coating or dipping), a method in which a nickel or a nickel compound film is formed by sputtering, or a method in which gaseous organic nickel is used as a precursor material of a vapor phase deposition using heat, light and/or plasma as an energy source. In all the methods, the thickness of the layer may be determined according to the amount of nickel needed.

When the nickel-containing layer is deposited by sputtering, nickel silicide may be used as a material for a sputtering target, besides nickel.

With respect to the methods involving coating and drying a solution among the methods for forming the nickel-containing layer, an aqueous solution or an organic solvent solution can be used as the solution. Here, the term "containing" includes both the meaning of containing as a compound and the meaning of containing as a dispersion.

When a solvent selected from water, alcohol, acid and ammonia, which are polar solvents, is used as the solvent, the nickel compound constituting the solute are typically selected from among nickel bromide, nickel acetate, nickel oxalate, nickel carbonate, nickel iodide, nickel nitrate, nickel sulfate, nickel formate, nickel acetylacetonate, nickel 4-cyclohexylbutyrate, nickel oxide, and nickel hydroxide.

When a solvent selected from among benzene, toluene, xylene, carbon tetrachloride, chloroform, and ether, which are non-polar solvents, is used, the nickel compound selected from among nickel acetylacetonate and nickel 2-ethylhexanoate can be typically used. Naturally, other solvents and solutes may be used.

It is also useful to add a surfactant to the solution containing the catalyst element. This is to enhance adhesion to the surface to be coated and to control absorption of the solution. This surfactant may be coated in advance on the surface to be coated.

When an elemental nickel is used as the catalyst element, it must be dissolved in an acid to make a solution.

What was described above is an example that a solution in which the catalyst element nickel is completely dissolved is used; however, a material like an emulsion in which a powder comprising a nickel element or a nickel compound is evenly dispersed in a dispersion medium without the nickel being completely dissolved. Further, a solution for forming an oxide film may be used. Such solutions include OCD (Ohka Diffusion Source) produced by Tokyo Ohka Kogyo Co., Ltd. The use of this OCD solution makes it possible to readily form a silicon oxide film by coating it on the surface on which the film is to be formed and baking at about 200° C. Nickel can be diffused in an amorphous silicon film by incorporating nickel into this silicon oxide film.

When a polar solvent like water is used as the solvent, the solution is repelled when the solution is coated directly onto the amorphous silicon film. In this case, a thin oxide film of 100 Å or less is first formed, and a solution containing a catalyst element is coated thereon, whereby the solution can be coated evenly. Also methods for improving wetting by adding a material like a surfactant to the solution are effective as well.

Direct coating on the amorphous silicon film can be carried out using a non-polar solvent like a toluene solution of nickel 2-ethylhexanoate as the solution. In this case, it is effective and preferable to coat in advance a material like an adhesive used in coating a resist. However, attention has to be paid so that too much is not coated, otherwise the addition of the catalyst element to the amorphous silicon will be actually be obstructed.

The amount of nickel contained in the solution depends on the type of the solution. As a general standard, the nickel amount in the solution should be 200 ppm to 1 ppm, preferably 100 ppm to 1 ppm (by weight). This is a value determined in view of the nickel concentration and hydrofluoric acid resistance of the film after the crystallization.

A nickel-containing layer is formed in contact with an amorphous silicon film constituting the first layer and then heat treated at 450° to 550° C. for 4 to 8 hours to effect thermal crystallization. The crystalline silicon film thus obtained contains trace amounts of nickel as impurities.

Then, an amorphous silicon film constituting the second layer is formed on the crystalline silicon film. It is subjected to the same heat treatment as the first layer to obtain a crystalline silicon film. In the crystal growth of the amorphous silicon film constituting the second layer, the parts contacting the surfaces of the crystalline silicon film constituting the first layer are crystallized in succession with the crystalline structure of the surface of the crystalline silicon film constituting the first layer as a nucleus for the crystal growth. Since no nickel is introduced into this amorphous silicon film constituting the second layer, impurities are not substantially contained, and a crystalline silicon film suitable as a semiconductor layer is obtained.

A crystalline silicon film containing substantially no impurities can be obtained in a low temperature process by forming the crystalline silicon film in two layers separately as in the present invention.

When the two-layer crystalline silicon film thus obtained is used as a thin film semiconductor layer in a TFT, since a channel is formed substantially to a depth of about 200 to 300 Å, the crystalline silicon film formed as the second layer constitutes a substantially active layer.

That is, since the crystalline silicon film constituting the second layer containing substantially no nickel is used as a semiconductor layer of a TFT, good device characteristics and reliability can be obtained.

DETAILED DESCRIPTION OF THE PREFERRED EMBODIMENTS

Preferred Embodiment 1

Figure 1A:
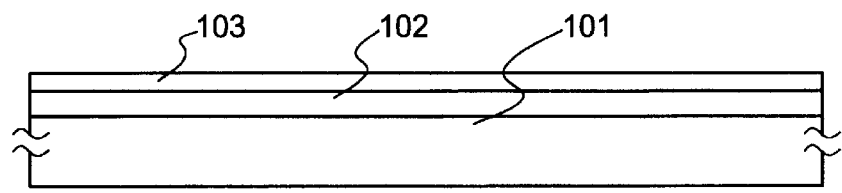
FIGS. 1(A) to 1(D) show the process of Preferred Embodiment 1.
Figure 1B:
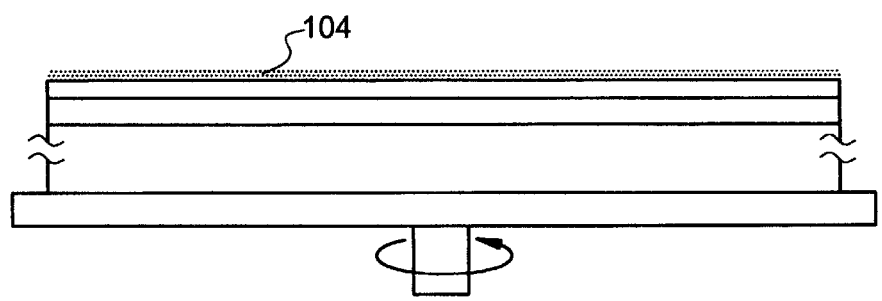
Figure 1C:
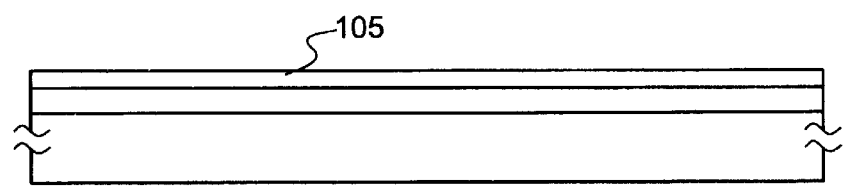
Figure 1D:
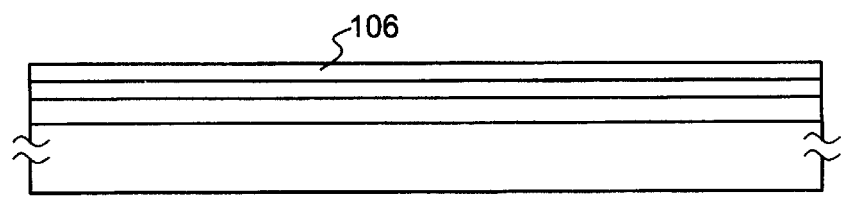

The present embodiment is shown in FIGS. 1(A) to 1(D). The present preferred embodiment is an example in which nickel for promoting crystallization is introduced into an amorphous silicon film and then crystallization is carried out by a thermal crystallization. An amorphous silicon film is then further formed on this crystalline silicon film and crystallized by thermal crystallization.

First, silicon oxide film 102 was formed to 1000 to 5000 521, for example 4000 Å on a substrate 101 (Corning 7059, 100 mm×100 mm) as a base oxide film by sputtering. This silicon oxide film 102 is provided in order to prevent impurities from diffusing from the glass substrate. Then, an amorphous silicon film 103 was formed to 300 to 1500 Å by plasma CVD or LPCVD. Here, the amorphous silicon film 103 was formed to a thickness of 500 Å by plasma CVD. (FIG. 1 (A))

Thereafter, a layer 104 (nickel-containing layer) containing nickel or a nickel compound of several to several tens of Å was formed on the amorphous silicon film 103. The nickel-containing layer can be formed by a method in which a solution containing nickel is coated and then dried (for example, spin coating or a dipping), a method in which a nickel or a nickel compound film is formed by sputtering, or a method in which a gaseous organic nickel is decomposed and deposited by a vapor phase method using heat, light and/or plasma as an energy source. Here, the film was formed by a spin coating method. (FIG. 1 (B))

First, an oxide film is formed to 10 to 50 Å on the amorphous silicon film 103 by irradiation with UV rays in an oxygen atmosphere, thermal oxidation or treatment with hydrogen peroxide. Here, the oxide film was formed to 20 Å by irradiation with UV rays in an oxygen atmosphere. This oxide film is for spreading an acetate solution containing nickel over the whole surface of the amorphous silicon film in the following process of coating the acetate solution; that is, it is to improve wetting.

Next, a solution was prepared by adding nickel to an acetate solution. The concentration of nickel was set to 25 ppm. Then, 2 ml of this acetate solution was dropped onto the surface of the substrate while the substrate was rotated, and this state was maintained for 5 minutes to spread the nickel acetate solution evenly over the substrate. Then, the speed was raised to carry out spin drying (2000 rpm, 60 seconds).

The concentration of nickel in the acetate solution is 1 ppm or more for practical use. A nickel acetate layer 104 having an average thickness of 20 Å could be formed on the surface of the amorphous silicon film after the spin drying by carrying out this coating process of the nickel solution once or several times. The layer can be formed similarly using other nickel compounds. The inventors of the present invention confirmed that the nickel compound layer was substantially homogenous.

In the present embodiment, a method by which nickel or a nickel compound is introduced on the amorphous silicon film was shown, but a method by which nickel or a nickel compounds is introduced under the amorphous silicon film may alternatively be employed. In this case, the nickel or nickel compounds is introduced before forming the amorphous silicon film.

Heat treatment was then carried out at 550° C. for 4 hours in a nitrogen atmosphere in a heating furnace. This produced a crystalline silicon film 105 constituting a first layer on the substrate. (FIG. 1 (C))

An amorphous silicon film was formed to 200 to 800 Å, for example 500 Å on this crystalline silicon film 105 by plasma CVD. Then, heat treatment was carried out again at 550° C. for 4 hours in a nitrogen atmosphere in a heating furnace. This resulted in a crystalline silicon film 106 constituting a second layer being obtained on the crystalline silicon film 105 constituting the first layer. (FIG. 1 (D))

In this case, the nickel which was added in carrying out the crystallization is present as impurities in the crystalline silicon film 105 constituting the first layer, but no impurities are contained in the crystalline silicon film 106 constituting the second layer, and therefore a semiconductor layer having good device characteristics can be obtained. In the crystal growth of the crystalline silicon film 106 constituting the second layer, crystal growth reflecting the crystal structure of the crystalline silicon film 105 constituting the first layer therebelow can be observed. Accordingly, since the crystalline silicon film 105 constituting the first layer grew longitudinally, corresponding growth has observed in the crystalline silicon film 106 constituting the second layer also.

Preferred Embodiment 2

The present embodiment is an example in which a silicon oxide film of thickness 1200 Å is provided selectively on an amorphous silicon film, and nickel is selectively introduced with this silicon oxide film being used as a mask to crystallize the amorphous silicon film. The silicon oxide film is then etched and a crystalline silicon film constituting a second layer is obtained in the same way as in preferred embodiment 1.

Figure 2A:
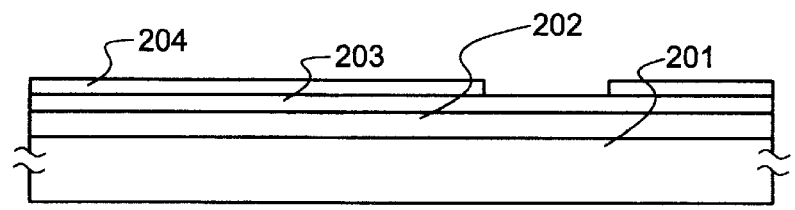
FIGS. 2(A) to 2(D) show the process of Preferred Embodiment 2.
Figure 2B:
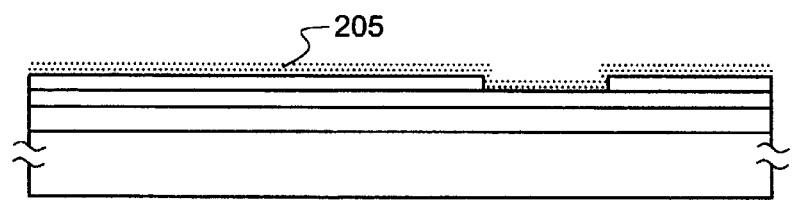
Figure 2C:
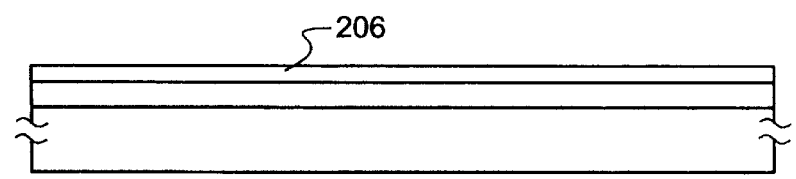
Figure 2D:
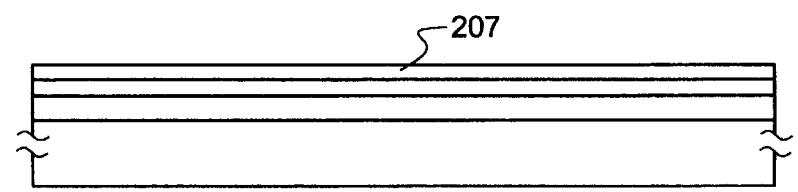

An outline of the production process of this preferred embodiment is shown in FIGS. 2(A) to 2(D). First, a silicon oxide film 202 was formed to 5000 Å as a base oxide film on a substrate 201 by depositing TEOS by plasma CVD. An amorphous silicon film 203 was then formed to a thickness of 500 Å by plasma CVD.

Then, a silicon oxide film 204 constituting a mask was formed on the amorphous silicon film 203 to a thickness of 1000 Å or more, here 1200 Å. The silicon oxide film 204 was patterned to a required pattern by a conventional photolithography patterning process. (FIG. 2 (A))

Then, a nickel-containing layer 205 of several to several tens of Å was formed on the amorphous silicon film 203. Here, a nickel layer 205 having an average thickness of 20 Å was formed by sputtering. This layer does not necessarily form a complete film. (FIG. 2(B))

The thermal crystallization was then carried out. Here, heat treatment was carried out at 550° C. (nitrogen atmosphere) for 8 hours to crystallize the amorphous silicon film 203. In this case, nickel was introduced from an aperture part formed by the patterning of the silicon oxide film 204, and crystal growth proceeded in a lateral direction from the region into which this nickel had been introduced to the region into which the nickel had not been introduced.

Then, the nickel-containing layer 205 remaining on the crystalline silicon film 206 was removed with a chlorine etchant. The silicon oxide film 204 which had been used as a mask was removed with buffered hydrofluoric acid. (FIG. 2 (C))

An amorphous silicon film was then formed to 200 to 800 Å, for example 300 Å on the crystalline silicon film 206 obtained in the process described above by plasma CVD. Then, thermal crystallization was carried out again at 550° C. for 8 hours in a heating furnace in a nitrogen atmosphere. As a result, a crystalline silicon film 207 constituting a second layer has obtained on the crystalline silicon film 206 constituting a first layer. In this case, trace amounts of nickel were contained as impurities in the crystalline silicon film 206 constituting the first layer as is the case in the Preferred Embodiment 1, but impurities were not contained in the crystalline silicon film 207 constituting the second layer. Since the crystalline silicon film 206 constituting the first layer grew laterally, in the crystalline silicon film 207 constituting the second layer also crystal growth reflecting the crystalline structure of the lower layer was observed.

Preferred Embodiment 3

This preferred embodiment is an example in which a crystalline silicon film formed utilizing the method of the present invention is used to obtain a TFT.

Figure 3A:
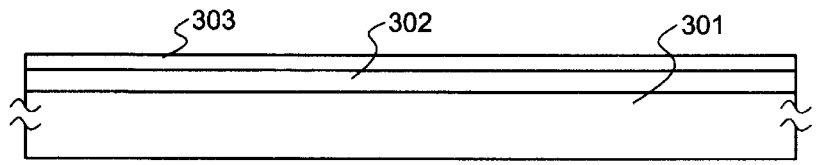
FIGS. 3(A) to 3(F) show the process of Preferred Embodiment 3.
Figure 3B:
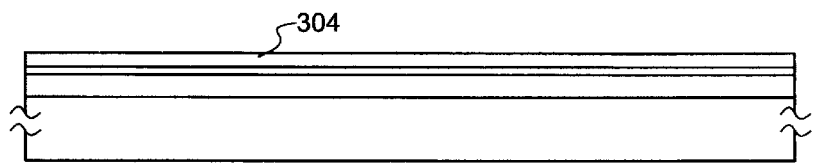
Figure 3C:
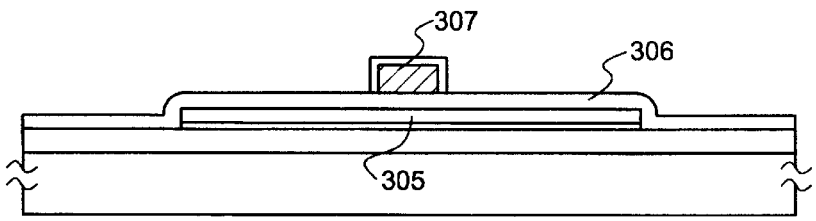
Figure 3D:
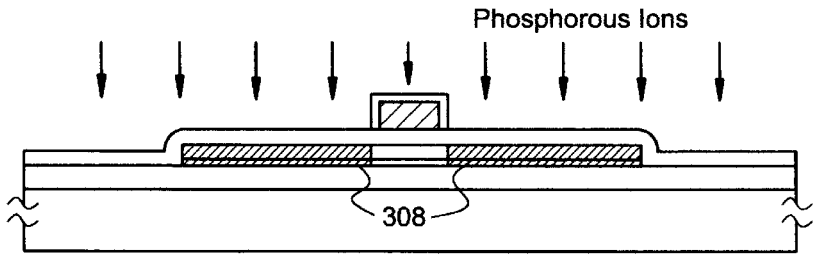
Figure 3E:
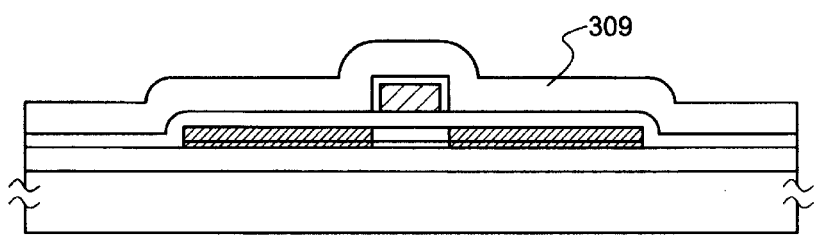
Figure 3F:
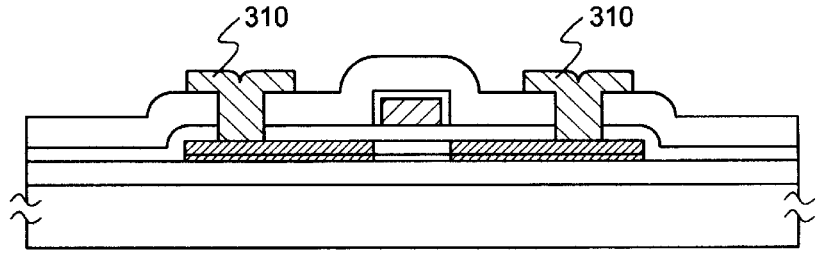

An outline of the production process of the present preferred embodiment is shown in FIGS. 3(A) to 3(F). First, a base silicon oxide film 302 was formed to a thickness of 2000 Å on a substrate 301. Then, an amorphous silicon film was formed to a thickness of 500 Å by plasma CVD. After treating with hydrofluoric acid to remove a natural oxide film, a thin oxide film was formed to a thickness of about 20 Å by irradiation with UV rays in an oxygen atmosphere.

An acetate solution containing 10 ppm nickel was coated and held for 5 minutes, after which spin drying has carried out using a spinner. Then, heat was applied at 550° C. for 4 hours in a nitrogen atmosphere to crystallize the silicon film into a crystalline silicon film 303. (FIG. 3 (A))

The nickel-containing layer remaining on the crystalline silicon film 303 was then removed by etching with a chlorine etchant. Here, the etching may be carried out leaving about 200 Å of the crystalline silicon film 303 remaining.

An amorphous silicon film was formed to 400 Å on this crystalline silicon film 303 by plasma CVD. Then, heat treatment was carried out again at 550° C. for 4 hours in a heating furnace in a nitrogen atmosphere.

As a result, a crystalline silicon film 304 constituting a second layer has obtained on the crystalline silicon film 303 constituting a first layer. (FIG. 3 (B))

Next, the crystalline silicon films of these two layers were patterned to form an island region 305. This island region 305 constitutes an active layer of a TFT. Silicon oxide having a thickness of 200 to 1500 Å, here 1000 Å was formed as a gate insulating film 306 by plasma CVD.

Then, an aluminum (containing Si, 1 wt % or Sc, 0.1 to 0.3 wt %) film having a thickness of 1000 Å to 3 µm, for example 5000 Å was formed by sputtering, and this was patterned to form a gate electrode 307. Next, the substrate was dipped in an ethylene glycol solution containing 1–3% tartaric acid and of a pH approximately 7, and anodic oxidation was carried out with platinum as a cathode and this aluminum gate electrode 307 as an anode. The anodic oxidation was finished after initially raising the voltage up to 220 V at a fixed current and maintaining the voltage at 220 V for one hour. Thus, an anodic oxide having a thickness of 1500 to 3500 Å, for example 2000 Å was formed. (FIG. 3 (C))

Then, an impurity (phosphorus) was injected into the silicon film by ion doping with the gate electrode 307 used as a mask. Phosphine gas ($PH_3$) was used as the doping gas. In this case, the dose amount was $1 \times 10^{14}$ to $5 \times 10^{17}$ $cm^{-2}$, and the accelerating voltage was 10 to 90 kV, for example the dose amount being set to $2 \times 10^{15}$ $cm^{-2}$ and the accelerating voltage to 80 kV. This resulted in an N type impurity region 308 being formed (source/drain region). (FIG. 3 (D))

A KrF excimer laser (wavelength: 248 nm, pulse width: 20 nsec) was used to irradiate and activate the impurity region 308. A suitable energy density of the laser was 200 to 400 $mJ/cm^2$, and preferably 250 to 300 $mJ/cm^2$. This process may be carried out by the heat annealing.

Next, a silicon oxide film 309 was formed as an interlayer insulating film 309 to a thickness of 3000 Å by plasma CVD. In this case, TEOS and oxygen were used for the feed gas. (FIG. 3 (E))

The interlayer insulating film 309 and the gate insulating film 306 were then etched to form contact holes to the source and the drain.

Then, an aluminum film was formed by sputtering and then patterned to form source and drain electrodes 310, whereby a TFT was produced. (FIG. 3 (F))

After forming the TFT, hydrogenation treatment may further be carried out at 200° to 400° C. for activation of the impurity region.

Preferred Embodiment 4

This preferred embodiment is an example in which a crystalline silicon film formed by utilizing the method of the present invention is used to obtain a CMOS type TFT.

Figure 4A:
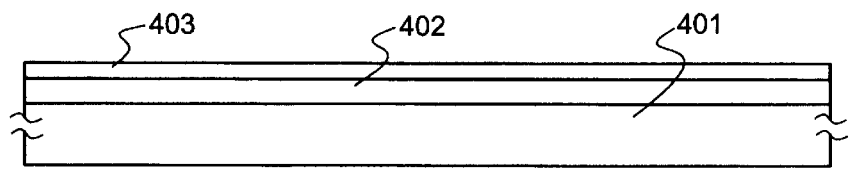
FIGS. 4(A) to 4(F) show the process of Preferred Embodiment 4.
Figure 4B:
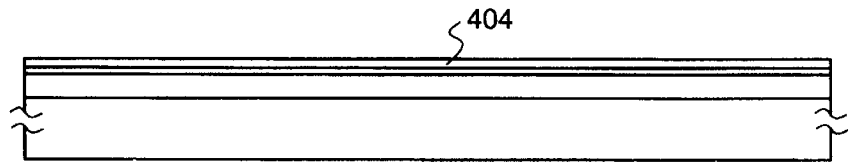
Figure 4C:
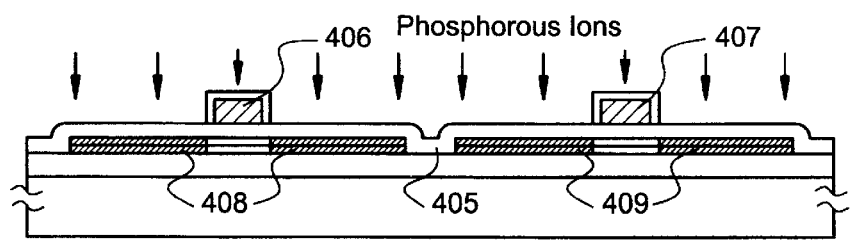
Figure 4D:
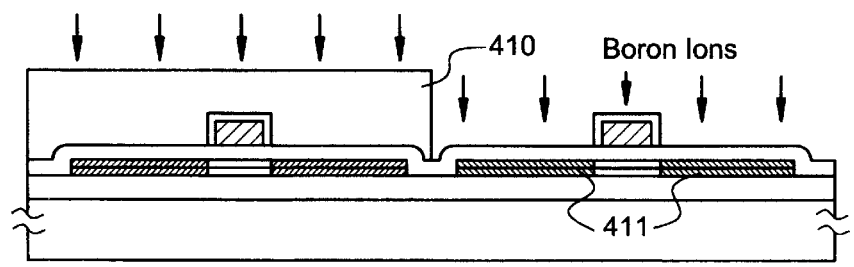

An outline of the production process of this preferred embodiment is shown in FIGS. 4(A) to 4(D). First, a base silicon oxide film 402 was formed to a thickness of 3000 Å on a substrate 401. An amorphous silicon film was then formed to a thickness of 500 Å by plasma CVD. Then, a silicon oxide film constituting a mask was formed on the amorphous silicon film to a thickness of 1200 Å. The silicon oxide film was patterned to a required pattern by a conventional photolithography patterning process to form an aperture part from which nickel would be introduced. A thin oxide film was formed to a thickness of about 20 Å by irradiation with UV rays in an oxygen atmosphere.

Figure 4E:
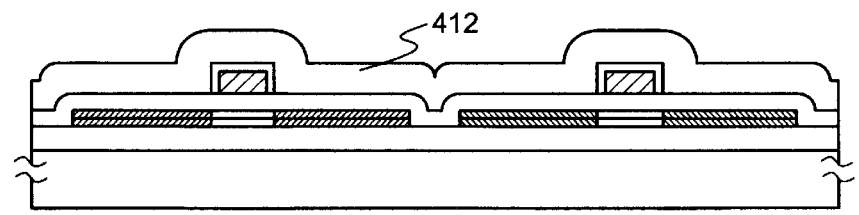
Figure 4F:
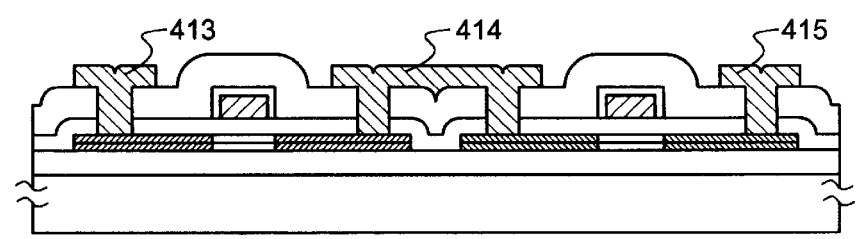

An acetate solution containing 50 ppm of nickel was coated and held for 5 minutes, after which spin drying was carried out using a spinner. Then, heat was applied at 550° C. for 8 hours in a nitrogen atmosphere to crystallize the silicon film into a crystalline silicon film 403. (FIG. 4 (A))

After that, the nickel-containing layer remaining on the crystalline silicon film 403 was removed by etching with a chlorine etchant. Also, the silicon oxide film which had been used as the mask was removed with buffered hydrofluoric acid. Here, etching may be carried out leaving about 200 Å of the crystalline silicon film 403 remaining.

An amorphous silicon film was formed to 300 Å on this crystalline silicon film 403 by plasma CVD. Then, heat treatment was carried out again at 550° C. for 8 hours in a heating furnace in a nitrogen atmosphere.

This produced a crystalline silicon film 404 constituting a second layer on the crystalline silicon film 403 constituting a first layer. (FIG. 4 (B)).

Next, the crystallized silicon films were patterned to form an island region. This island region constitutes an active layer of a TFT. Silicon oxide having a thickness of 200 to 1500 Å, here 1000 Å was formed as a gate insulating film 405 by plasma CVD.

After that, an aluminum (containing Si, 1 wt % or Sc, 0.1 to 0.3 wt %) film having a thickness of 1000 Å to 3 $\mu$m, for example 5000 Å was formed by sputtering, and this was patterned to form gate electrodes 406 and 407. Next the substrate was dipped in a 1 to 3% solution of tartaric acid in ethylene glycol, of pH about 7, and anodic oxidation was carried out with platinum as a cathode and these aluminum gate electrodes 406 and 407 as anodes. The anodic oxidation was finished after initially raising the voltage up to 220 V at a fixed current and then maintaining the voltage at 220 V for one hour. Thus, an anodic oxide having a thickness of 1500 to 3500 Å, for example 2000 Å was formed.

Then, impurities were injected into the insular silicon film by ion doping with the gate electrodes 406 and 407 used as a mask. Here, phosphorus has used as an N type impurity and boron as a P type impurity. First, phosphorus was injected into the whole surface. In this case, the dose amount was $1\times10^{14}$ to $5\times10^{17}$ cm$^{-2}$, and the accelerating voltage was 10 to 90 kV, for example the dose amount being set to $1\times10^{15}$ cm$^{-2}$ and the accelerating voltage to 80 kV. As a result, N type impurity regions 408 and 409 were formed. (FIG. 4(C))

Next, boron was injected with the N channel type TFT region covered with a photoresist 410. In this case, the dose amount was several to several tens of times as much as for the N type impurity region, here $4\times10^{15}$ cm$^{-2}$, and the accelerating voltage was set to 65 kV. As a result, the part which had been the N type impurity region 409 has inverted and a P type impurity region 411 has formed. (FIG. 4(B))

The doped impurity regions 408 and 411 were activated by irradiation with a KrF excimer laser (wavelength: 248 nm, pulse duration: 20 nsec). A suitable energy density of the laser was 200 to 400 mJ/cm$^2$, and preferably 250 to 300 mJ/cm$^2$. This process may be carried out by the heat annealing.

Next, a silicon oxide film 412 formed as an interlayer insulating film 412 to a thickness of 3000 Å by plasma CVD. (FIG. 4 (E))

The interlayer insulating film 412 and the gate insulating film 405 were then etched to form contact holes to the source and the drain. Then, an aluminum film was formed by sputtering and patterned to form source/drain electrodes 413, 414 and 415. A CMOS type TFT was produced by the processes described above. (FIG. 4 (F)).

According to the present invention, crystalline silicon films having few impurities can be formed at lower temperatures than in the past by forming a crystalline silicon film in two layers. A device having good characteristics can be obtained by making a semiconductor device using crystalline silicon films thus obtained.

While the preferred embodiments of the present invention are described above, the present invention should not be limited to these examples.

What is claimed is:

1. A semiconductor device comprising:
    source and drain regions formed on an insulating surface, said source and drain regions having first crystalline semiconductor layer being formed on said insulating surface and second crystalline semiconductor layer being formed on said first semiconductor layer;
    a channel region formed between said source and drain regions, said channel region having said first semiconductor layer being formed on said insulating surface and said second semiconductor layer being formed on said first semiconductor layer,
    wherein said first semiconductor layer comprises a catalyst element for crystallizing said semiconductor at first concentration while said second semiconductor layer is free from said catalyst element or comprises said catalyst element at a second concentration lower than said first concentration.

2. A device according to claim 1 wherein said catalyst element comprises at least a material selected from the group consisting of Ni, Pt, Cu, Ag, Au, In, Sn, Pd, P, As, and Sb.

3. A device according to claim 1 further comprising a gate electrode over said second semiconductor layer having a gate insulating film therebetween.

4. A device according to claim 1 wherein said first and second semiconductor layers are silicon.

5. A semiconductor device comprising:
    a crystalline semiconductor island formed on an insulating surface, said semiconductor island comprising a first semiconductor layer being formed on said insulating surface and a second semiconductor layer being formed on said first semiconductor layer, wherein said semiconductor island includes,
source and drain regions including said first and second semiconductor layers,
a channel region formed between said source and drain regions, said channel region including said first and second semiconductor layers, and
wherein said first semiconductor layer comprises a catalyst element for crystallizing said semiconductor at a first concentration while said second semiconductor layer comprises said catalyst element at a second concentration not higher than said first concentration.

6. A device according to claim 5 wherein said catalyst element comprises at least a material selected from the group consisting of Ni, Pt, Cu, Ag, Au, In, Sn, Pd, P, As, and Sb.

7. A device according to claim 5 further comprising a gate electrode over said second semiconductor layer having a gate insulating film therebetween.

8. A device according to claim 5 wherein said semiconductor island is silicon.

9. A semiconductor device including at least a thin film transistor, said thin film transistor comprising:
a crystalline semiconductor island formed on an insulating surface, said semiconductor island comprising a first semiconductor layer being formed on said insulating surface and a second semiconductor layer being formed on said first semiconductor layer,
wherein said semiconductor island includes,
source and drain regions including said first and second semiconductor layers,
a channel region formed between said source and drain regions, said channel region including said first and second semiconductor layers; and
a gate electrode formed over said channel region having a gate insulating film therebetween,
wherein said first semiconductor layer comprises a catalyst element for crystallizing said semiconductor at a first concentration while said second semiconductor layer comprises said catalyst element at a second concentration not higher than said first concentration, and
wherein said catalyst element comprises at least a material selected from the group consisting of Ni, Pt, Cu, Ag, Au, In, Sn, Pd, P, As, and Sb.

10. A device according to claim 9 wherein said semiconductor island is silicon.

11. A semiconductor device including at least a n-channel thin film transistor, said n-channel thin film transistor comprising:
a crystalline semiconductor island formed on an insulating surface, said semiconductor island comprising a first semiconductor layer being formed on said insulating surface and a second semiconductor layer being formed on said first semiconductor layer,
wherein said semiconductor island includes,
source and drain regions including said first and second semiconductor layers, said source and drain regions containing n-type impurity;
a channel region formed between said source and drain regions, said channel region including said first and second semiconductor layers; and
a gate electrode formed over said channel region having a gate insulating film therebetween,
wherein said first semiconductor layer comprises a catalyst element for crystallizing said semiconductor at a first concentration while said second semiconductor layer comprises said catalyst element at a second concentration not higher than said first concentration, and
wherein said catalyst element comprises at least a material selected from the group consisting of Ni, Pt, Cu, Ag, Au, In, Sn, Pd, P, As, and Sb.

12. A device according to claim 11 wherein said semiconductor island is silicon.

* * * * *